United States Patent [19]

Jastrzebski

[11] 4,360,963
[45] Nov. 30, 1982

[54] METHOD OF MAKING CCD IMAGERS WITH REDUCED DEFECTS

[75] Inventor: Lubomir L. Jastrzebski, Plainsboro, N.J.

[73] Assignee: RCA Corporation, New York, N.Y.

[21] Appl. No.: 288,687

[22] Filed: Jul. 31, 1981

[51] Int. Cl.³ .............................................. H01L 21/26
[52] U.S. Cl. .................................. 29/571; 29/576 B; 29/577 C; 29/578; 148/1.5; 148/187
[58] Field of Search ................... 148/187, 1.5; 29/578, 29/576 B, 577 C, 571

[56] References Cited

U.S. PATENT DOCUMENTS

| | | | |
|---|---|---|---|
| 3,853,634 | 12/1974 | Amelio | 148/1.5 |
| 4,027,382 | 6/1977 | Tasch et al. | 29/578 |
| 4,055,884 | 11/1977 | Jambotkar | 29/578 X |
| 4,076,557 | 2/1978 | Huang et al. | 148/187 X |
| 4,099,317 | 7/1978 | Su | 29/578 |
| 4,148,132 | 4/1979 | Bower | 29/571 |
| 4,173,064 | 11/1979 | Farnow | 29/571 X |
| 4,179,793 | 12/1979 | Hagiwara | 29/578 |
| 4,216,574 | 8/1980 | Feist | 29/578 |
| 4,247,862 | 1/1981 | Klein | 148/1.5 X |
| 4,251,571 | 2/1981 | Garbarino et al. | 148/187 X |

Primary Examiner—G. Ozaki
Attorney, Agent, or Firm—Birgit E. Morris; Donald S. Cohen; William J. Burke

[57] ABSTRACT

In a method of making a CCD imager on a semiconductor wafer, it is usual to have the imagers spaced from the outer periphery of the wafer. The method includes a sequence of steps including masking the appropriate surface of the wafer, defining openings in the mask and forming doped regions in the wafer through the opening. In accordance with this invention, the region of the semiconductor wafer adjacent the outer periphery is not doped during any doping steps. It has been found that with this method, dislocations do not nucleate and propagate into the area of the wafer where the CCD imagers are to be formed and that white spots and lines in the visual image formed from the imager are significantly reduced.

8 Claims, 5 Drawing Figures

METHOD OF MAKING CCD IMAGERS WITH REDUCED DEFECTS

BACKGROUND OF THE INVENTION

This invention relates to a method of making large scale integrated circuits, e.g., charge coupled devices (hereinafter referred to as CCD's) and, more particularly, to a method of making CCD's used as imaging arrays.

CCD arrays are very large scale integrated circuits that have come to be used as imagers in television cameras. These imagers include a photosensing register, often referred to as an A register, a temporary storage register, often referred to as a B register and an output register, often referred to as a C register. The A and B registers are generally identical and each includes a plurality of channels, each having a plurality of stages, formed adjacent one surface of a semiconductor body. The C register has a number of stages equal to the number of channels in the A and B registers and outputs to a transistor amplifier. As is usual, the channels are separated by channel stops and excess charge drains as should be understood by those skilled in the art. Over the registers there is formed an oxide layer and over this layer, control electrodes that control the storage and transfer of charge along the channels.

In use, the B and C registers are usually masked against light and the A register is associated with a lens that focuses light thereon. Light from an image generates photocharge in the A register which is accumulated in the channels, then transferred to the B register whereupon photogeneration can then reoccur in the A register. The charge in the B register is transferred into the C register one line at a time from where it is read serially by the output transistor amplifier.

One problem with the images displayed from these devices is the presence of white spots and lines. These spots and lines, of course, detract from the quality of the picture.

SUMMARY OF THE INVENTION

This invention discloses a method of making CCD imagers where the displayed image has a significantly reduced number of white spots and lines. In the usual method of making a CCD imager on a semiconductor wafer, the imager is spaced from the outer periphery of the semiconductor wafer on which it is formed. The following sequence of steps are performed; one surface of the wafer is masked; openings are defined in the mask; and doped regions are formed in the semiconductor wafer adjacent the openings. The improvement in accordance with this invention comprises the step of preventing dopant from being deposited into the region of the semiconductor surface that is adjacent the outer periphery thereof.

This is in contrast to the methods used to date in which it has been usual to deposit and diffuse dopants into the surface regions of the wafer that surround the device to be formed.

BRIEF DESCRIPTION OF THE DRAWING

For a better understanding of the invention, reference is made to the following description of a preferred embodiment thereof, taken in conjunction with the figures of the accompanying drawing, in which.

DETAILED DESCRIPTION OF A PREFERRED EMBODIMENT

Figure 1:
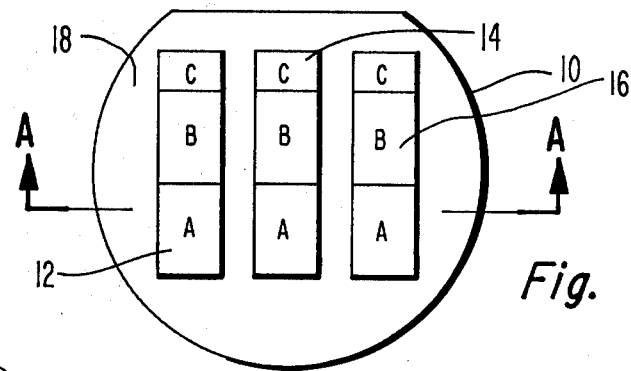
FIG. 1 is a top plan view schematically illustrating a semiconductor wafer on which a plurality of CCD imagers are formed.
Figure 2:
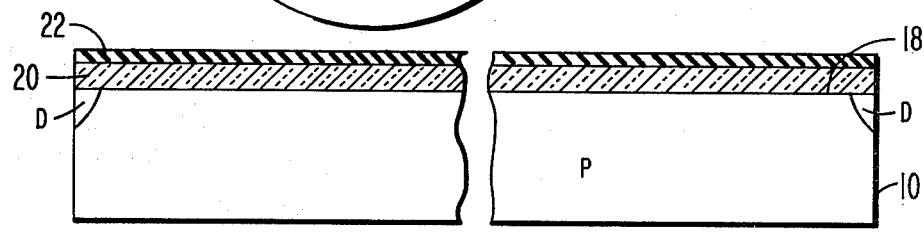
FIGS. 2-5 are section views taken generally along a line corresponding to the line A—A of FIG. 1 and illustrate a semiconductor wafer on which CCD imagers are being made by a method in accordance with this invention at various times during that method.

In FIG. 1 there is schematically illustrated a semiconductor wafer 10, most usually silicon, on which three CCD imagers 12, 14 and 16 are formed. The imagers 12, 14 and 16 are the same and generally include various regions doped with N type conductivity atoms and other regions doped with P type conductivity atoms so as to form the various channels along which the charge is stored and transferred, channel stops between these channels, excess charge or "anti-blooming" drains and an output transistor all of which are well known to those skilled in the art. None of these regions are illustrated in FIG. 1 since their large number would generally confuse the drawing and since the particulars of such devices are well understood by those skilled in the art. FIG. 1 does depict the A, B and C registers normally formed on such devices in order to facilitate an understanding of the invention.

Three CCD imagers are usually made on a wafer although more or less could be so made. When formed, the imagers 12, 14 and 16 are spaced apart from each other and are also spaced from the outer periphery of the wafer. Those regions of the wafer 10 where the imagers 12, 14 and 16 are to be formed will be referred to as the active regions of the wafer and that region surrounding the active regions will be referred to as the inactive region. After they are completely formed, the imagers 12, 14 and 16 are separated from each other by generally conventional techniques.

The process of making the imagers 12, 14 and 16 usually includes the steps of masking one surface 18 of the device in which the imagers are to be formed. After the masking, suitable openings are formed in the mask to expose regions of the surface 18. Thereafter, dopant, either P or N type depending on which structure of the imager is being formed, is deposited into the wafer 10 through the various openings. Usually, the inactive region of the wafer is also doped because it greatly simplifies the making of the photomasks. It is this doping of the inactive region of the wafer, particularly at the surface area adjacent the outer periphery of the wafer, that has now been found to be the ultimate cause of a significant portion of the white spots and lines in the images displayed from the devices 12, 14 and 16.

After a careful investigation of the problem, I discovered that the white spots and lines result from spurious charge added to any packet of photogenerated charge. A sufficient amount of spurious charge added to any photogenerated charge will produce a white spot or line in the visible image. My investigation led me to the conclusion that the sources of a significant amount of spurious charge are high current generation sites located in the semiconductor material and that these sites are formed by crystallographic defects known as dislocations. I then found that the source of the dislocations in the imagers is at the outer periphery of the wafer where weak spots in the form of slight cracks, fractures and other mechanical damage common at the outer edge formed nucleation sites. Dopant usually deposited there during the diffusion or ion implantation processes used in forming these imagers decreases the energy required for dislocation nucleation and thus these dislocations multiply. These initially formed dislocations result from the mechanical stress induced in the weak spots by the lattice mismatch between doped and undoped regions of the crystal. I also discovered that these initially formed dislocations propagate from their nucleation sites to the interior of the wafer during subsequent processing steps, this propagation being caused by thermal stress introduced into the wafer during the various heating and cooling cycles used in the manufacturing process. Eventually, dislocation networks propagate into the active regions of the wafer and form the high current generation sites noted previously.

In accordance with this invention, the nucleation of dislocations at the periphery and their subsequent propagation into the wafer is significantly reduced by not diffusing or implanting any dopant into the wafer surface adjacent the outer periphery thereof. It has been found that not doping a region spaced inwardly from the outer periphery of the wafer a distance of at least about 2 mm is sufficient to reduce white spots and lines on a visual image by one-half when compared to the image developed from a similarly processed wafer where dopant was diffused adjacent the outer periphery. The most convenient way of preventing the diffusion or implant of dopant into the surface area adjacent the periphery of the wafer is to mask that surface area during the doping steps. Since this area is in the inactive region, device performance is not affected.

Figure 3:
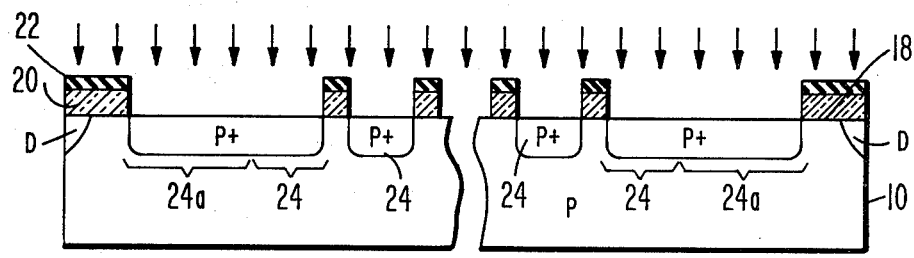
Figure 4:
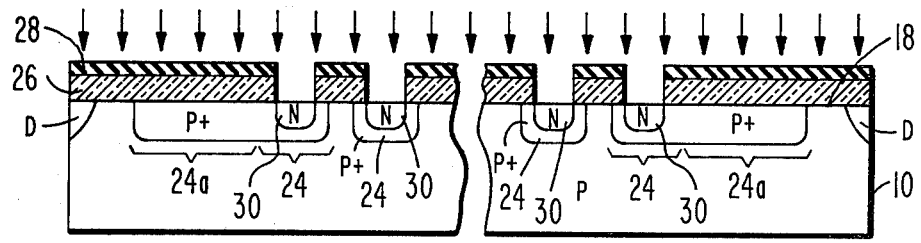

Referring now to FIGS. 2-6, a simplified example of a method in accordance with this invention is illustrated. The CCD imager being formed includes surface channel devices for the A and B registers and a buried channel device for the C register. The wafer 10 is a silicon wafer doped with P type conductivity atoms. The doping concentration of the P type atoms is preferably about $10^{15}$ atoms/cm$^3$. Illustrated in the drawing are mechanical defects D at the outer periphery of the wafer 10. It is these defects D which are the ultimate source of the dislocations as explained previously. Over the surface 18 in which the imagers 12, 14 and 16 are to be formed there is thermally grown a masking oxide layer 20. The oxide layer 20 must be thick enough to prevent the diffusion or implantation of dopant atoms therethrough so that the underlying surface of the silicon wafer 10 is protected. This can be accomplished, for example, in an ambient of steam and hydrogen chloride (HCl) at a temperature of about 900° C. for about 5½ hours. This will form an oxide layer 20 having a thickness of about 4800 to 5400 Angstroms. Over the top of the masking oxide layer 20 there is deposited, by generally conventional techniques, a photoresist 22 which is then processed in accordance with generally conventional photolithographic techniques to define protected and unprotected areas with the protected areas being located over the surface regions to be protected from dopants and with the unprotected areas overlying the surface regions to be doped. After the photolithography, the unprotected regions of the oxide 20 are etched in a suitable etchant, for example, buffered hydrofluoric (HF) acid to expose those regions of the surface 18 that are to be doped, e.g., by ion implantation, as illustrated in FIG. 3 of the drawing. At this time in the exemplary method disclosed here, the channel stops 24 are to be formed and extend the length of the A and B registers.

In addition to doping the wafer to form the channel stops 24, it is usual to dope the inactive region adjacent the outermost channel stop as shown at 24a in FIG. 3. In accordance with this invention, the inactive region of the surface 18 adjacent the outer periphery of the wafer is not doped. Thus, as illustrated in FIG. 3 of the drawing, a portion of the oxide layer 20 and of the photoresist 22 are kept in place to mask surface 18 adjacent the outer periphery of the wafer 10. As noted previously, the masking material is maintained a distance of about 2 mm inwardly from the outer periphery of the wafer, but is should be understood that the masking material could extend farther inwardly and terminate adjacent the outer periphery of the closest channel stop 24 to be formed. Next, P type dopant such as boron is deposited and diffused into the exposed surface regions of the wafer 10. This deposition can be accomplished in accordance with conventional techniques such as ion implantation.

After this diffusion, the oxide layer 20 and photoresist material 22 are stripped from the wafer. Then, another masking oxide layer 26 is formed over the surface 18 in a manner similar to that previously described with respect to the masking oxide layer 20. A photoresist 28 is then deposited over the oxide layer 26 in accordance with conventional techniques. Photolithographic techniques are again utilized to define protected and unprotected areas in the photoresist layer 28. In this definition, the unprotected areas of the photoresist 28 correspond to those areas over the surface 18 of the wafer 10 where anti-blooming drains 30 are to be formed. The unprotected areas of the oxide layer 26 are then etched to expose the regions of the surface 18 where the anti-blooming drains 30 are to be formed. The drains 30 are formed by diffusing an N conductivity type dopant material into the exposed regions of the surface 18. This doping can be accomplished by generally conventional techniques, such as ion implant of phosphorus atoms and subsequent diffusion thereof. During this deposition the masking oxide layer 26 and photoresist 28 are kept in place to protect the surface of the wafer adjacent its periphery from the dopant atoms.

It should be understood that other doping steps may be carried out depending on the structure of the output transistor, the exact configuration of the A and B registers and also of the C register. During any such additional doping steps, the surface region adjacent to the outer periphery of the wafer is similarly masked and protected from dopant.

Figure 5:
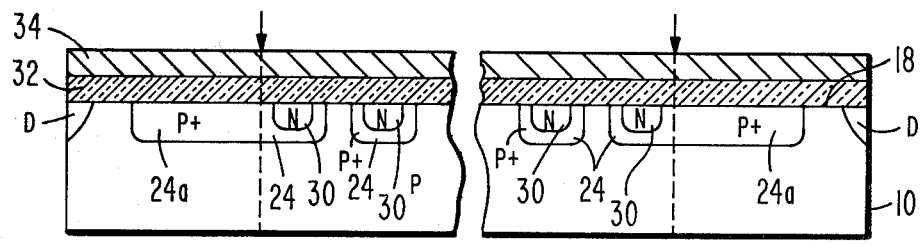

Referring next to FIG. 5, the masking oxide layer 26 and photoresist 28 are stripped from the surface 18. Thereafter, an insulating or channel oxide layer 32 is formed over the surface 18 and then, electrodes 34 are formed over the channel oxide layer. The electrodes 34 can be polysilicon which is uniformly deposited over the insulating layer 32 and then doped with conductivity type atoms at appropriate locations to form the electrodes. These techniques are well known in the art and need not be explained here. After the formation of the oxide layer 32 and electrodes 34, the individual CCD arrays 12, 14 and 16 are separated from each other and from the inactive region of the wafer 10. Separation from the inactive region is done along the dotted lines illustrated in FIG. 5 and may be accomplished by any of a variety of conventional techniques.

While in the foregoing there has been described a preferred embodiment of the invention, it should be understood by those skilled in the art that various changes and modifications can be made without departing from the true spirit and scope of the invention as recited in the appended claims.

I claim:

1. In a method of making a large scale integrated circuit device on a semiconductor wafer with said device being spaced from the outer periphery of said wafer, said method including the following sequence of steps: masking a surface of said wafer; defining openings in the mask; and forming doped regions of semiconductor material through said openings; the improvement comprising: preventing dopants from being deposited into the region of said surface adjacent said periphery.

2. In a method in accordance with claim 1 wherein said sequence of steps is performed a plurality of times and wherein each time dopants are prevented from being deposited into said surface region adjacent said periphery.

3. In a method in accordance with claim 1 wherein said region of said surface adjacent said periphery extends inwardly from said periphery a distance of about 2 mm.

4. In a method in accordance with claim 1 wherein the dopants are prevented from being deposited by masking said surface region adjacent said periphery when forming said doped regions of said semiconductor material.

5. In a method in accordance with claim 4 wherein said sequence of steps is performed a plurality of times and wherein each time said surface region adjacent said periphery is masked.

6. In a method of making a CCD imager including a photosensing register and a temporary storage register each including a plurality of channels, an output register and an output transistor and further including appropriately doped channel stops and excess charge drains, said method including the steps of forming an oxide layer over one surface of a semiconductor wafer, depositing a photoresist over said oxide layer, defining openings in said oxide layer and said photoresist and depositing dopants into the regions of said wafer adjacent said openings, the improvement comprising: preventing dopants from being deposited into the region of said surface adjacent said periphery.

7. In a method in accordance with claim 6 wherein said region of said surface adjacent said periphery extends inwardly from said periphery a distance of at least about 2 mm.

8. In a method in accordance with claim 6 wherein said region of said surface adjacent said periphery is masked to prevent the deposition of dopants.

* * * * *